(12) United States Patent
Usui et al.

(10) Patent No.: US 11,011,694 B2
(45) Date of Patent: May 18, 2021

(54) VIBRATING DEVICE AND TACTILE SENSE PRESENTING DEVICE

(71) Applicant: Murata Manufacturing Co., Ltd., Nagaokakyo (JP)

(72) Inventors: Kentaro Usui, Nagaokakyo (JP); Junichi Hashimoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 703 days.

(21) Appl. No.: 15/866,622

(22) Filed: Jan. 10, 2018

(65) Prior Publication Data
US 2018/0130941 A1 May 10, 2018

Related U.S. Application Data

(63) Continuation of application No. PCT/JP2016/078830, filed on Sep. 29, 2016.

(30) Foreign Application Priority Data

Sep. 30, 2015 (JP) .............................. JP2015-192485

(51) Int. Cl.
*H01L 41/04* (2006.01)
*G06F 3/041* (2006.01)
(Continued)

(52) U.S. Cl.
CPC .......... *H01L 41/042* (2013.01); *B06B 1/0688* (2013.01); *G06F 3/016* (2013.01); *G06F 3/041* (2013.01); *G09G 2310/0264* (2013.01)

(58) Field of Classification Search
CPC ..... H01L 41/02; H01L 41/193; H01L 41/113; H01L 41/1132; H01L 41/1138;
(Continued)

(56) References Cited

U.S. PATENT DOCUMENTS

| 4,045,695 A | * | 8/1977 | Itagaki | ................. H04R 17/005 310/322 |
| 5,867,302 A | * | 2/1999 | Fleming | ................. B81B 3/0054 310/328 |

(Continued)

FOREIGN PATENT DOCUMENTS

JP  2015-75856 A    4/2015
WO  WO 2012/157691 A1  11/2012
(Continued)

OTHER PUBLICATIONS

International Search Report issued for PCT.JP2016/078830, dated Nov. 15, 2016.
(Continued)

*Primary Examiner* — J. San Martin
(74) *Attorney, Agent, or Firm* — Arent Fox LLP

(57) ABSTRACT

A tactile sense presenting device that includes a control unit, a driving unit, and a vibrating device. The vibrating device includes a diaphragm, a piezoelectric film that is bridged over the diaphragm and stretches and contracts in a planar direction, and spacers that are provided in a gap portion, in which the piezoelectric film and the diaphragm face each other, and are fixed to the diaphragm.

20 Claims, 7 Drawing Sheets

(51) Int. Cl.
*B06B 1/06* (2006.01)
*G06F 3/01* (2006.01)

(58) Field of Classification Search
CPC ............ G06F 3/016; G06F 2310/0264; G09G 2310/0264; B06B 1/0688
See application file for complete search history.

(56) References Cited

U.S. PATENT DOCUMENTS

| | | | |
|---|---|---|---|
| 7,663,604 B2 * | 2/2010 | Maruyama | ............ G06F 1/1637 |
| | | | 345/173 |
| 9,332,353 B2 | 5/2016 | Ando | |
| 10,509,470 B2 * | 12/2019 | Usui | ....................... G06F 3/041 |
| 2013/0335375 A1 * | 12/2013 | Nishikawa | ............ G06F 3/0443 |
| | | | 345/174 |
| 2014/0079255 A1 | 3/2014 | Ando | |
| 2017/0083099 A1 * | 3/2017 | Hashimoto | ........... H01L 41/053 |
| 2017/0160808 A1 * | 6/2017 | Hashimoto | ......... G06F 3/03547 |

FOREIGN PATENT DOCUMENTS

| | | | | |
|---|---|---|---|---|
| WO | WO 2015/076321 A1 | 5/2015 | | |
| WO | WO-2015190358 A1 * | 12/2015 | ............ | G06F 3/0414 |

OTHER PUBLICATIONS

Written Opinion of the International Searching Authority issued for PCT/JP2016/078830, dated Nov. 15, 2016.

* cited by examiner

FIG. 3
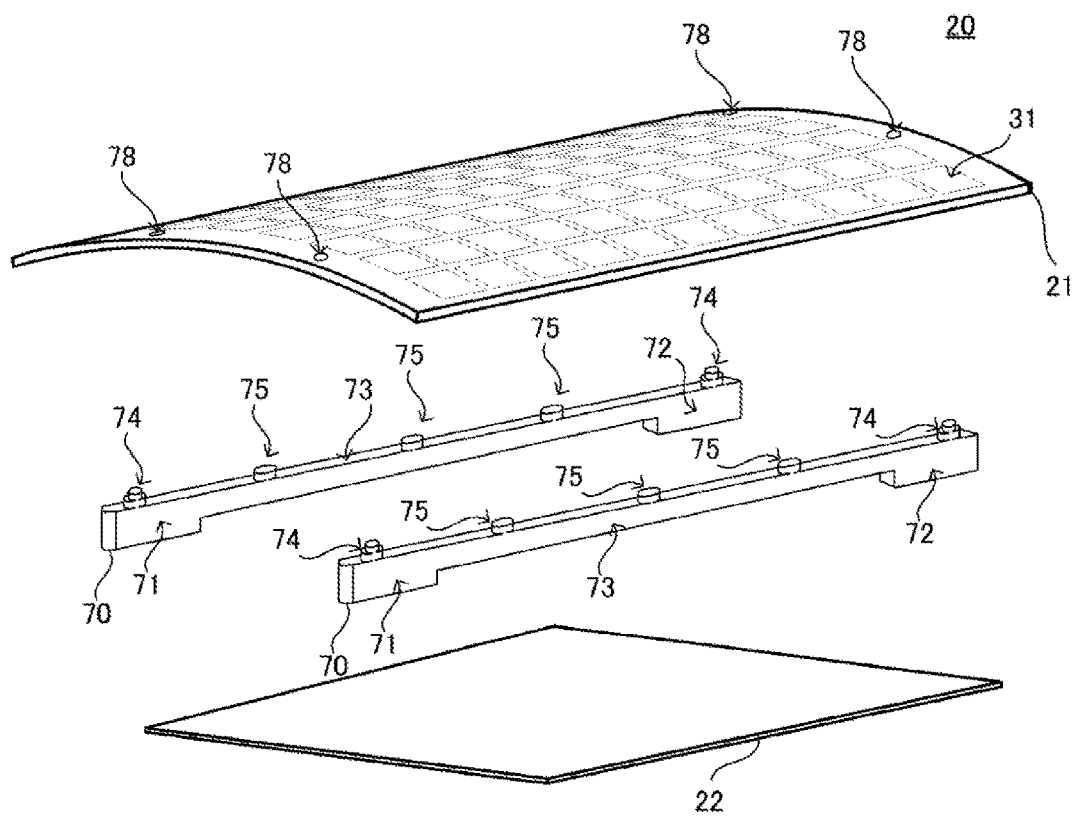
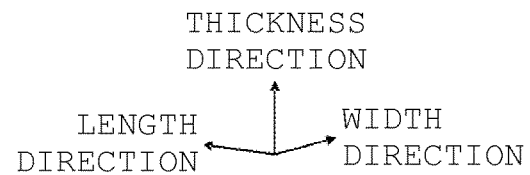

PRIOR ART

VIBRATING DEVICE AND TACTILE SENSE PRESENTING DEVICE

CROSS REFERENCE TO RELATED APPLICATIONS

The present application is a continuation of PCT/JP2016/078830 filed Sep. 29, 2016, which claims priority to Japanese Patent Application No. 2015-192485, filed Sep. 30, 2015, the entire contents of each of which are incorporated herein by reference.

TECHNICAL FIELD

The present disclosure relates to a vibrating device that vibrates a diaphragm by using a stretching and contracting film, and a tactile sense presenting device which includes the vibrating device.

BACKGROUND

Conventionally, a vibrating device that vibrates a diaphragm by driving a film such as a piezoelectric film is widely used. Such vibrating devices can be used, for example, for a flat speaker or a haptics device (tactile sense presenting device). For example, Patent Document 1 (identified below) discloses a flat speaker that vibrates a diaphragm by stretching and contracting a piezoelectric film.

FIG. 9 is a side view of a vibrating device 101 according to Patent Document 1. As shown, the vibrating device 101 includes an exciter film 102, a diaphragm 103, frame members 104 and 105, and a piezoelectric film 106.

The piezoelectric film 106 is attached to a surface of the exciter film 102 that faces the diaphragm 103. The frame members 104 and 105 are provided between the both ends of the exciter film 102 and the both ends of the diaphragm 103, respectively. The center of the diaphragm 103 warps so as to separate from the piezoelectric film 106 and the exciter film 102. As a result, the diaphragm 103 pulls the piezoelectric film 106 and the exciter film 102 outward in a length direction with the frame members 104 and 105 interposed therebetween.

In the vibrating device 101, when a drive voltage is applied to the piezoelectric film 106, the piezoelectric film 106 stretches and contracts in the planar direction. Then, as the piezoelectric film 106 stretches and contracts, the tension of the exciter film 102 fluctuates and the diaphragm 103 vibrates.

Patent Document 1: WO 2012/157691 A.

The conventional vibrating device 101 illustrated in FIG. 9 can also be configured as a haptics device (tactile sense presenting device). For example, in the tactile sense presenting device, a touch sensor (not illustrated) that detects a user's touch operation is provided to the diaphragm 103, and the touch sensor detects the user's touch operation on the diaphragm 103. Then, when the touch sensor detects the touch operation, the tactile sense presenting device applies a drive voltage to the piezoelectric film 106. As a result, the piezoelectric film 106 stretches and contracts in the planar direction, the tension of the exciter film 102 fluctuates, and the diaphragm 103 vibrates. Consequently, it is possible to give a tactile sense feedback to the user who touches the diaphragm 103.

In this regard, when the user's force to press the diaphragm 103 is strong, the diaphragm 103 is pushed and a gap between the diaphragm 103 and the film is crushed in some cases. Then, the diaphragm 103 hardly warps, and it becomes difficult to give the tactile sense feedback to the user who presses the diaphragm 103.

SUMMARY OF THE INVENTION

It is therefore an object of the present disclosure to provide a vibrating device and a tactile sense presenting device that minimizes deterioration of vibration characteristics even when a diaphragm is greatly pressed.

Thus, an exemplary vibrating device is disclosed that includes a diaphragm; a film that is bridged facing the diaphragm and stretches and contracts in a planar direction; and a spacer that is provided in a gap portion, in which the film and the diaphragm face each other, and is fixed to the diaphragm.

In this configuration, since the spacer is provided in the gap between the diaphragm and the film, the gap between the diaphragm and the film is not crushed, and stretch and contraction of the film can be reliably transmitted to the diaphragm. In addition, since the spacer is fixed to the diaphragm, it is possible to prevent displacement of the spacer and vibrate the diaphragm with stable vibration characteristics.

In one exemplary aspect of the vibrating device disclosed herein, the spacer is preferably slidable with respect to the film. In this configuration, stretch and contraction of the film in the planar direction are hardly inhibited by the spacer. Also, even when the film is deformed, for example, elongated due to aging, the spacer will not move or deform. As a result, the vibration characteristics of the diaphragm can be made more stable.

Preferably, the exemplary vibrating device disclosed herein further includes an opening that is formed in one of the diaphragm and the spacer; and a first protrusion that is formed on another one of the diaphragm and the spacer and fitted in the opening. With this configuration, even when the size of the fixing portion of the spacer with respect to the diaphragm is extremely small, a larger fixing force can be obtained than a fixing force for fixing the spacer to the diaphragm by other methods such as bonding. Accordingly, displacement of the spacer can be more reliably prevented. In addition, since an adhesive is unnecessary for fixing the spacer, the vibrating device can be easily manufactured.

In one exemplary aspect of the vibrating device disclosed herein, the opening may be a through-hole formed in the diaphragm. With this configuration, it is easy to mold the opening. In addition, it is also possible to more firmly fix the spacer by bonding the opening and the first protrusion with an adhesive or the like. Moreover, it is possible to check whether or not the protrusion is inserted in the through-hole after the vibrating device is assembled. Also, the spacer can be fixed by pouring the adhesive from the outside after the vibrating device is assembled. Consequently, the vibrating device can be manufactured easily.

In an aspect of the exemplary vibrating device, the opening may be formed in a recess shape in the diaphragm. With this configuration, it is possible to prevent the first protrusion of the spacer from being exposed on the surface of the diaphragm opposite to the spacer.

In another exemplary aspect of the vibrating device disclosed herein, the first protrusion is preferably formed at a position at which the first protrusion does not face the film. As a result, the portion of the spacer which faces the film becomes deformable, and this portion slightly moves following the vibration of the film, so that it is possible to reduce a frictional resistance of the film. Therefore, the stretch and contraction of the film are hardly inhibited.

In an exemplary aspect of the vibrating device disclosed herein, the spacer preferably further includes a second protrusion which is in contact with the diaphragm. With this configuration, it is possible to prevent the spacer from deforming so as to approach the diaphragm as the film stretches and contracts. Further, the area of the spacer which is in contact with the diaphragm can be reduced, and the vibration of the diaphragm is hardly inhibited by the spacer.

In an exemplary aspect of the vibrating device disclosed herein, the first protrusion preferably includes a large diameter portion which has a larger cross sectional area than that of the opening and is not inserted into the opening. With this configuration, it is possible to prevent deformation of the spacer around the first protrusion, and it is possible to accurately set and maintain the interval between the diaphragm and the film.

In an exemplary aspect of the vibrating device disclosed herein, the spacer preferably further includes a support leg that protrudes toward a side opposite to the diaphragm of the film. In this configuration, since the diaphragm and the film are indirectly supported with the spacer interposed therebetween, the vibration of the diaphragm and the stretch and contraction of the film hardly leak to the outside.

Further, a tactile sense presenting device is disclosed herein that includes the vibrating device; a detecting unit that is attached to the diaphragm and detects a touch operation; and a control unit that drives the film when the detecting unit detects the touch operation.

In the exemplary tactile sense presenting device employing such a configuration, even if the gap between the diaphragm and the film is about to be crushed by the pressing force by the touch operation, the gap is secured without being crushed due to the spacer fixed to the diaphragm. Accordingly, the original vibration characteristics of the diaphragm and the film can be prevented from greatly deteriorating, and the tactile sense feedback can be reliably presented to the operator.

According to the exemplary embodiments disclosed herein, the exemplar vibrating device and the exemplary tactile sense presenting device can secure a gap between the diaphragm and the film while preventing displacement of spacers by using the spacers fixed to the diaphragm, and vibrate the diaphragm with stable vibration characteristics.

BRIEF DESCRIPTION OF THE DRAWINGS

FIG. 3 is an exploded perspective view of the tactile sense presenting device according to the first exemplary embodiment.

DETAILED DESCRIPTION

Figure 1:
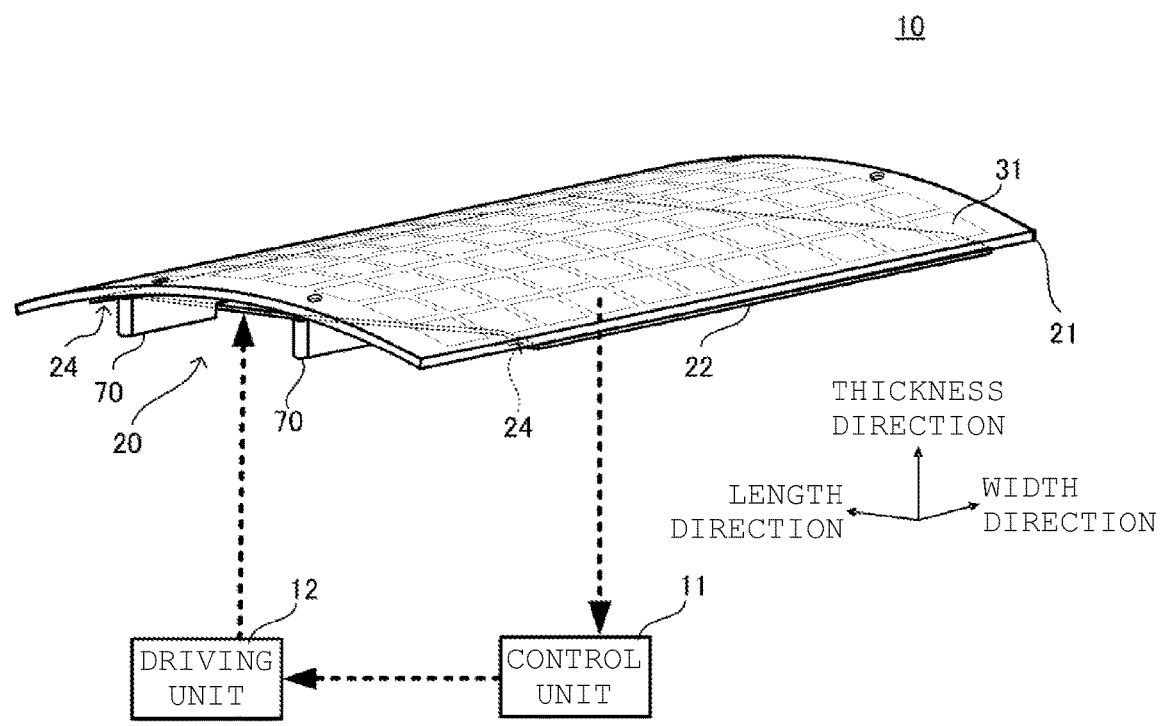
FIG. 1 is a perspective view of a tactile sense presenting device according to a first exemplary embodiment.

Hereinafter, a tactile sense presenting device and a vibrating device according to the present disclosure will be described based on the first exemplary embodiment. FIG. 1 is a perspective view of a tactile sense presenting device 10 and a vibrating device 20 according to the first embodiment.

In the present embodiment, the tactile sense presenting device 10 configures a touch sensor type keyboard. The exemplary tactile sense presenting device disclosed herein can also configure various types of devices such as keyboards and, in addition, touch panels and operation buttons which users touch.

According to an examplar aspect, the tactile sense presenting device 10 includes a control unit 11, a driving unit 12, the vibrating device 20, and a plurality of touch sensors 31. The vibrating device 20 includes a diaphragm 21, a piezoelectric film 22, and two spacers 70. The piezoelectric film 22 can correspond to an example of the film of the present disclosure.

As shown, the diaphragm 21 forms a top surface of the vibrating device 20. The diaphragm 21 has a rectangular shape when seen from a thickness direction of the vibrating device 20, and has short sides along a length direction of the vibrating device 20 and long sides along a width direction of the vibrating device 20. Further, the diaphragm 21 protrudes toward the top surface and is recessed toward a bottom surface when seen from the width direction of the vibrating device 20. The diaphragm 21 is made of a material such as FRP (Fiber Reinforced Plastic) which is elastically deformable in the thickness direction. In addition, the diaphragm 21 may be made of other materials such as a metal plate, PET, PMMA, polycarbonate (PC), and glass.

A plurality of touch sensors 31 are disposed on the top surface of the vibrating device 20 (diaphragm 21) so as to correspond to key alignment of the keyboard. Each touch sensor 31 outputs a detection signal to the control unit 11 when detecting a user's touch operation. The control unit 11 can be any type of processing device, processor, microprocessor, or the like, for example, and can be configured to output a control signal to the driving unit 12 when receiving an input of the detection signal from one of the touch sensors 31. The driving unit 12 can be configured to output a drive voltage to the piezoelectric film 22 of the vibrating device 20 when receiving an input of the control signal from the control unit 11.

The piezoelectric film 22 is disposed on the bottom surface side of the diaphragm 21. Both ends in the length direction of the piezoelectric film 22 are connected to the diaphragm 21 as fixed ends 24. That is, the piezoelectric film 22 is bridged between both ends in the length direction of the diaphragm 21 at the bottom surface side of the diaphragm 21. The piezoelectric film 22 has a property of stretching in the planar direction (at least the length direction) when a drive voltage is applied thereto.

More specifically, the piezoelectric film 22 is formed by providing electrodes which are not illustrated to both of entire principal surfaces of the film made of a piezoelectric material having piezoelectricity. The piezoelectric material of the piezoelectric film 22 is, for example, poly-L-lactic acid (PLLA) which is chiral polymers, and polyvinylidene fluoride (PVDF). When the piezoelectric film 22 is formed of PLLA, the piezoelectric film 22 is cut out from a film stretched in a direction indicated by an outlined arrow in FIG. 3 in a direction of approximately 45° which is the length direction with respect to the main extension direction. Consequently, the piezoelectric film 22 can have piezoelectricity for allowing the piezoelectric film 22 to stretch and contract in the length direction.

The piezoelectric film 22 is stretched on the bottom surface side of the diaphragm 21 in a state where the piezoelectric film 22 is applied with tension in the length direction. Thus, the diaphragm 21 elastically deforms so as to warp in the thickness direction. Thus, the diaphragm 21 and the piezoelectric film 22 constitute the vibrating device 20 formed in a bow shape when seen from the width direction.

The two spacers 70 are made of, for example, metal, PET, polycarbonate (PC), ABS resin, polypropylene (PP), or polystyrene (PS). The two spacers 70 are disposed in a gap portion in which the diaphragm 21 and the piezoelectric film 22 face each other, and are disposed in the length direction of the vibrating device 20. Each of the two spacers 70 has a shape extending in the width direction of the vibrating device 20. Since the two spacers 70 are disposed in the bow-shaped gap portion formed by the diaphragm 21 and the piezoelectric film 22, the gap portion is not completely crushed. Therefore, a minimum interval of the gap portion between the diaphragm 21 and the piezoelectric film 22 is defined by the dimension in the thickness direction of the spacers 70.

Figure 2A:
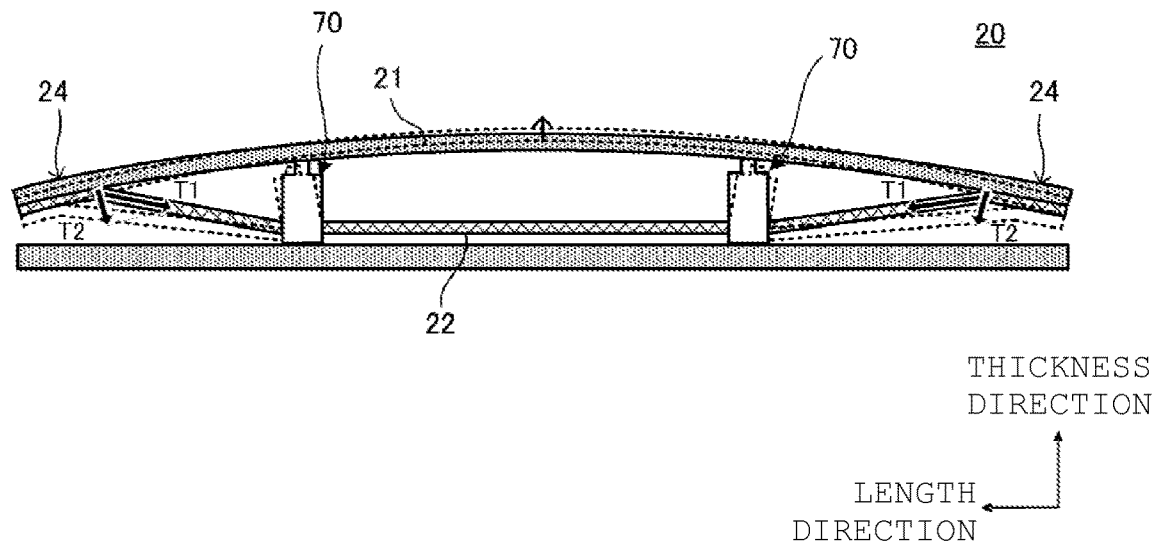
FIG. 2(A) is a side view illustrating the vibrating device according to the first exemplary embodiment from a width direction.

FIG. 2(A) is a side view illustrating the vibrating device 20 from the width direction. Dotted lines in FIG. 2(A) indicate the vibrating device 20 when the piezoelectric film 22 is contracted.

The spacers 70 are sandwiched between a lower surface of the diaphragm 21 and an upper surface of the piezoelectric film 22. Here, the thickness of each spacer 70 is larger than the interval in the length direction between the diaphragm 21 and the piezoelectric film 22 in the case where the spacers 70 are not provided. Hence, when the piezoelectric film 22 is not driven, the spacers 70 push the piezoelectric film 22 downward in the thickness direction, and the piezoelectric film 22 is bent downward at contact positions with the spacers 70.

When an alternating voltage is applied to the piezoelectric film 22 and the piezoelectric film 22 is driven, the piezoelectric film 22 repeatedly stretches and contracts in the length direction. Then, a tension T1 transmitting from the piezoelectric film 22 to the diaphragm 21 cyclically changes. Thus, a force component T2 of the tension T1 in a direction perpendicular to a surface of the fixed ends 24 also cyclically increases. Therefore, as indicated by the dotted lines in FIG. 2(A), a warp amount of the diaphragm 21 cyclically increases.

As a result, when the piezoelectric film 22 contracts, a center in the length direction of the diaphragm 21 is displaced upward, and when the piezoelectric film 22 stretches, the center in the length direction of the diaphragm 21 is displaced downward. Accordingly, the spacers 70 are cyclically displaced upward and downward, and an angle at which the piezoelectric film 22 bends at the contact positions with the spacers 70 also cyclically changes.

Figure 2B:
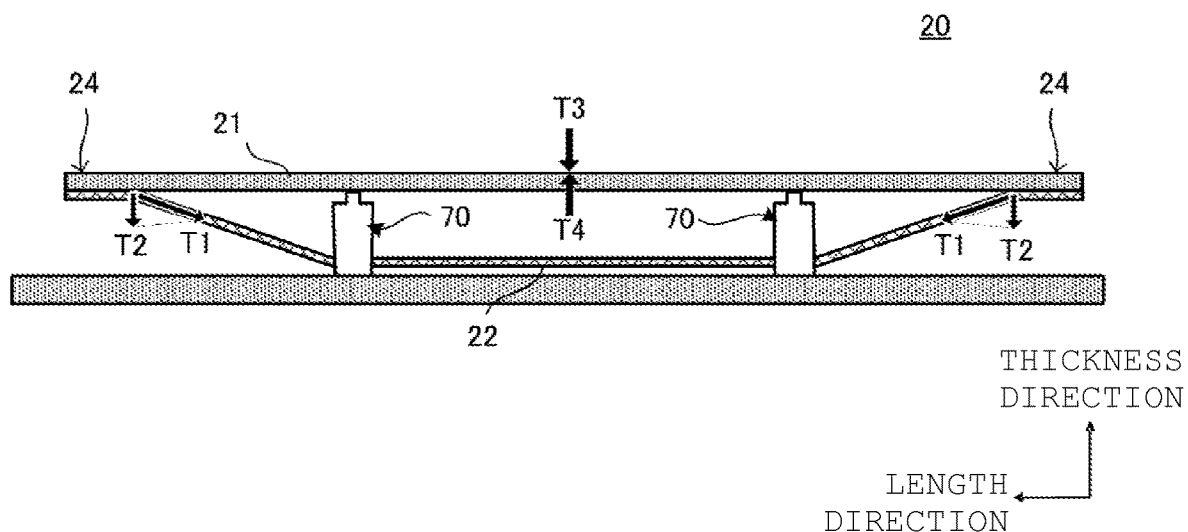
FIG. 2(B) is a side view for explaining a vibration mode of the vibrating device in a state where a pressing force produced by a touch operation is applied.

FIG. 2(B) is a side view for explaining a vibration mode of the vibrating device 20 in a state where a pressing force produced by a touch operation is applied.

In a state where a pressing force T3 of the finger which performs the touch operation is applied to the diaphragm 21 and the diaphragm 21 is pushed in a roughly flat shape, an elastic force of the vibrating device 20 produces a reaction force T4 with respect to the pressing force T3 and acts on the finger or the like. In this state, the spacers 70 are pushed downward together with the diaphragm 21, and the piezoelectric film 22 greatly bends compared to a case where the pressing force T3 is not applied.

That is, even when the pressing force T3 is applied to the diaphragm 21 and the diaphragm 21 is pushed in a roughly flat shape, the spacers 70 prevent the gap between the diaphragm 21 and the piezoelectric film 22 from being crushed, and the piezoelectric film 22 is kept in a state where the piezoelectric film 22 is stretched by the fixed ends 24. Consequently, even when the diaphragm 21 is in a flat state, the force component T2 of the tension T1 acts in a direction perpendicular to the surface of the fixed ends 24.

Hence, even when the alternating voltage is applied to the piezoelectric film 22 to drive in this state, the tension T1 transmitting from the piezoelectric film 22 to the diaphragm 21 and the force component T2 of the tension T1 cyclically increase, and the diaphragm 21 cyclically warps significantly. As a result, the reaction force T4 transmitted from the diaphragm 21 to the finger or the like which pushes the diaphragm 21 cyclically fluctuates.

As described above, the tactile sense presenting device 10 and the vibrating device 20 according to the present embodiment do not crush the gap between the diaphragm 21 and the piezoelectric film 22 by using the spacers 70, and can reliably give the tactile sense feedback to the user who performs the touch operation. Thus, in the tactile sense presenting device 10 and the vibrating device 20, the spacers 70 prevent the gap between the diaphragm 21 and the piezoelectric film 22 from being crushed. Consequently, it is possible to make the diaphragm 21 thin, suppress rigidity of the diaphragm 21, and make the warp amount of the diaphragm 21 large compared to the conventional technique.

Figure 4:
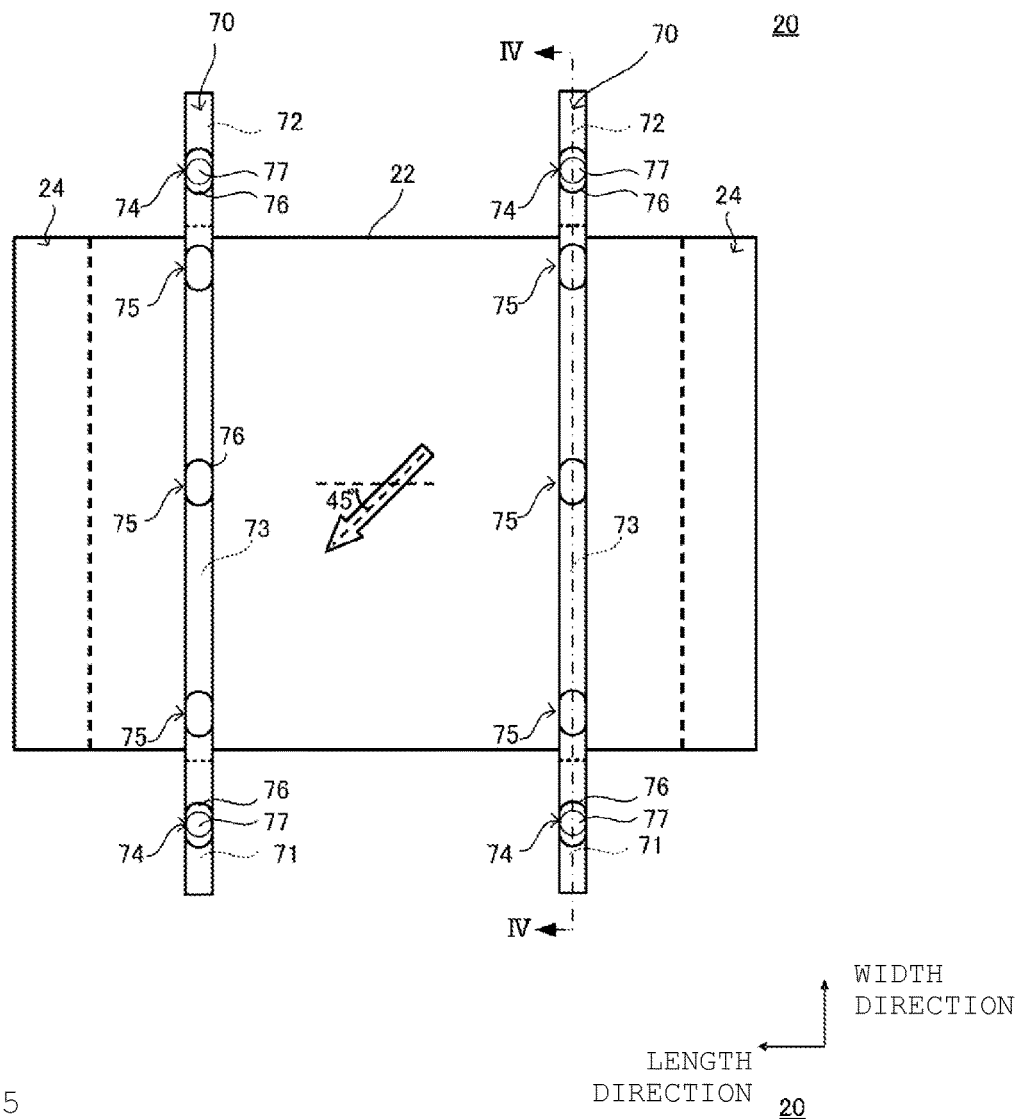
FIG. 4 is a plan view of the tactile sense presenting device according to the first exemplary embodiment without a diaphragm.
Figure 5:
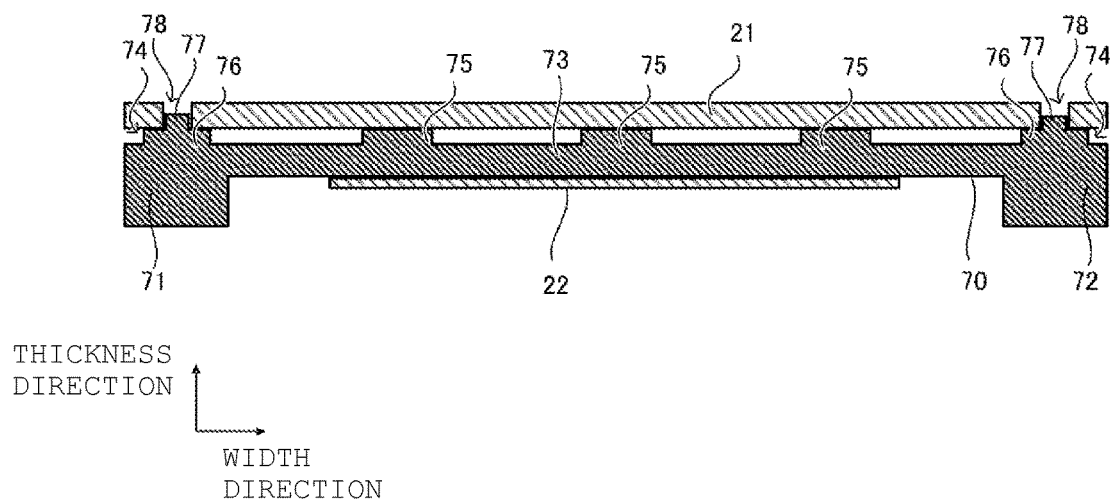
FIG. 5 is a cross-sectional view of the tactile sense presenting device according to the first exemplary embodiment.

Next, a more specific structure of each spacer 70 will be described. FIG. 3 is an exploded perspective view of the vibrating device 20. FIG. 4 is a plan view illustrating the vibrating device 20 from the top surface side as seen through the diaphragm 21. FIG. 5 is a cross-sectional view of the vibrating device 20 taken along line IV-IV illustrated in FIG. 4.

The above two spacers 70 each include two support legs 71 and 72, a beam 73, and a plurality of protrusions 74 and 75. The two support legs 71 and 72 are provided at both ends in the width direction of each spacer 70, and protrude on the bottom surface side with respect to the beam 73. The bottom surfaces of the two support legs 71 and 72 makes contact with the bottom plate of the tactile sense presenting device 10 which is not illustrated and a top surface of the table, and stabilize a posture of the tactile sense presenting device 10 with respect to an external structure. Note that the support legs 71 and 72 may not be formed integrally with the spacers 70, and may be formed separately from the spacers 70 to support the diaphragm 21.

The beam 73 is a portion extending between the two support legs 71 and 72 of each spacer 70. The top surface of the beam 73 forms a flat surface continuing to the top surfaces of the support legs 71 and 72. A bottom surface of the beam 73 is recessed on the top surface side with respect to the bottom surfaces of the support legs 71 and 72.

The dimension in the width direction of the beam 73 of the spacer 70, i.e., the length dimension of the beam 73 is slightly larger than the dimension in the width direction of the piezoelectric film 22, and the piezoelectric film 22 is slidably in contact with the bottom surface of the beam 73. Here, in a normal state where no external force is applied to the diaphragm 21, the piezoelectric film 22 is configured to come into contact with the bottom surface of the beam 73. However, the dimension in the thickness direction of the beam 73 may be set such that the piezoelectric film 22 does not come into contact with the bottom surface of the beam 73 in the normal state, and that the piezoelectric film 22 comes into contact with the bottom surface of the beam 73 when the diaphragm 21 is flattened.

The first protrusions 74 are disposed on the top surface side of the support legs 71 and 72. Further, the second protrusions 75 are disposed on the top surface side of the beam 73. That is, as illustrated in FIG. 3, the first protrusions 74 are disposed at positions at which the first protrusions 74 do not face the piezoelectric film 22. On the other hand, the second protrusions 75 are disposed at positions at which the second protrusions 75 face the piezoelectric film 22.

Further, each first protrusion 74 includes a large diameter portion 76 and a small diameter portion 77. The large diameter portion 76 is formed so as to protrude from the top surface of each of the support legs 71 and 72. The small diameter portion 77 is formed so as to protrude from the top surface of the large diameter portion 76. The size of the large diameter portion 76 seen from the top surface side is larger than the size of the small diameter portion 77. That is, the first protrusion 74 has a protruding shape protruding toward the top surface.

In the diaphragm 21, openings 78 penetrating the diaphragm 21 are formed at positions at which the openings 78 face the first protrusions 74. The small diameter portion 77 of each first protrusion 74 is fitted in each opening 78 of the diaphragm 21 (see FIG. 5). The large diameter portion 76 of the first protrusion 74 is not inserted in the opening 78, and a top face of the large diameter portion 76 is in contact with the bottom surface of the diaphragm 21. With such a configuration, the spacers 70 are fixed to the diaphragm 21.

Further, in the present embodiment, the small diameter portion 77 of each first protrusion 74 is formed in a columnar shape having a perfect circular cross section seen from the top surface side (see FIG. 4). The large diameter portion 76 and the second protrusion 75 of the first protrusion 74 are formed in columnar shapes having oval cross sections with the length direction of the vibrating device 20 as a lateral direction seen from the top surface side.

The spacers 70 configured as described above can prevent the entire top surfaces of the spacers 70 making contact with the diaphragm 21 by the second protrusions 75 disposed at the positions at which the second protrusions 75 overlap the piezoelectric film 22 seen from the top surface side. That is, an area of the contact portion between the spacers 70 and the diaphragm 21 can be reduced. Accordingly, the vibration of the diaphragm 21 is prevented from being constrained by the contact portion with the spacers 70 and deteriorating.

Since the spacers 70 are fixed by fitting the small diameter portions 77 of the first protrusions 74 and the openings 78 of the diaphragms 21 seen from the top surface side, the spacers 70 are fixed to the diaphragm 21 by a strong binding force. As a result, even when the spacers 70 are fixed to the diaphragm 21 by the small diameter portions 77 of the first protrusions 74 having very small sizes, the displacement hardly occurs. Therefore, in the tactile sense presenting device 10 and the vibrating device 20, the vibration characteristics hardly deteriorate due to the displacement of the spacers 70.

Since the first protrusions 74 fitted to the diaphragm 21 are formed at the positions at which the first protrusions 74 do not overlap the piezoelectric film 22 (the positions at which the first protrusions 74 overlap the support legs 71 and 72), the beams 73 overlapping the piezoelectric film 22 are slightly deformed in response to the vibration of the piezoelectric film 22. Accordingly, the frictional resistance between the piezoelectric film 22 and the beams 73 can be reduced, and the stretch and contraction of the piezoelectric film 22 is prevented from being inhibited by the spacers 70.

However, when the spacers 70 need to be more firmly fixed or when it is difficult to secure the number of the protrusions 74 and 75 in the spacers 70 due to spatial restrictions or the like, the first protrusions 74 may be formed at positions at which the first protrusions 74 overlap the piezoelectric film 22 (the positions at which the first protrusions 74 do not overlap the support legs 71 and 72). Further, the first protrusions 74 are not limited to the above-mentioned configuration in which the first protrusions 74 are formed at the two portions. The first protrusion 74 may be formed at at least one portion. The first protrusions 74 may be formed at three or more portions. In the case where the first protrusion 74 is formed at only one portion, it is possible to prevent the spacers 70 from rotating when cross-sectional shapes of the small diameter portions 77 are formed into non-circular shapes.

As described above, in the tactile sense presenting device 10 and the vibrating device 20 according to the present embodiment, the positions of the spacers 70 can be basically fixed without using an adhesive or the like. Consequently, it is possible to simplify a manufacturing process and suppress the number of constituent materials. However, when the spacers 70 need to be more firmly fixed, the openings 78 formed in the diaphragm 21 and the first protrusions 74 of the spacers 70 may be more firmly fixed by an adhesive or the like.

In the vibrating device 20 described above, it is preferable to set the frequency of the drive voltage to a resonance frequency of the diaphragm 21. Accordingly, a vibration amplitude of the diaphragm 21 is increased and a tactile sense feedback can be given to the user. Furthermore, the openings 78 are preferably formed near a node point of vibration of a resonance mode produced in the diaphragm 21. In this manner, the vibration of the diaphragm 21 hardly leaks to an external structure via the support legs 71 and 72 of the spacers 70. Consequently, the vibration amplitude of the diaphragm 21 can be increased. A drive frequency of the tactile sense presenting device 10 is not limited to the above resonance frequency, and a drive frequency different from the above resonance frequency may be adopted. Generally, the frequency of excellent vibration (which is high sensitivity) as a tactile sense feedback to the finger is 100 Hz to 300 Hz. Therefore, when a resonance frequency is outside 100 Hz to 300 Hz, a driving frequency of 100 Hz to 300 Hz may be adopted.

Further, in the above-described vibrating device 20, the two-step protrusions 74 and the one-step protrusions 75 exist in a mixed manner. However, for example, all protrusions may be formed in two-step protrusion shapes, and all protrusions may be fitted in the openings of the diaphragm. This case is advantageous compared to the above-described embodiment in that the spacers and the diaphragm can be more firmly fixed. However, in the case where two-step protrusions and the one-step protrusions exist in a mixed manner, the number of openings formed in the diaphragm can be reduced. Consequently, in terms of workability of the diaphragm, the above-described embodiment is more advantageous. Further, unless the openings are formed in a center portion of the diaphragm 21, there is no arrangement restriction on the touch sensor 31 disposed on the top surface of the diaphragm 21. Consequently, in terms of designability and aesthetics, the above-embodiment is more advantageous.

Figure 6:
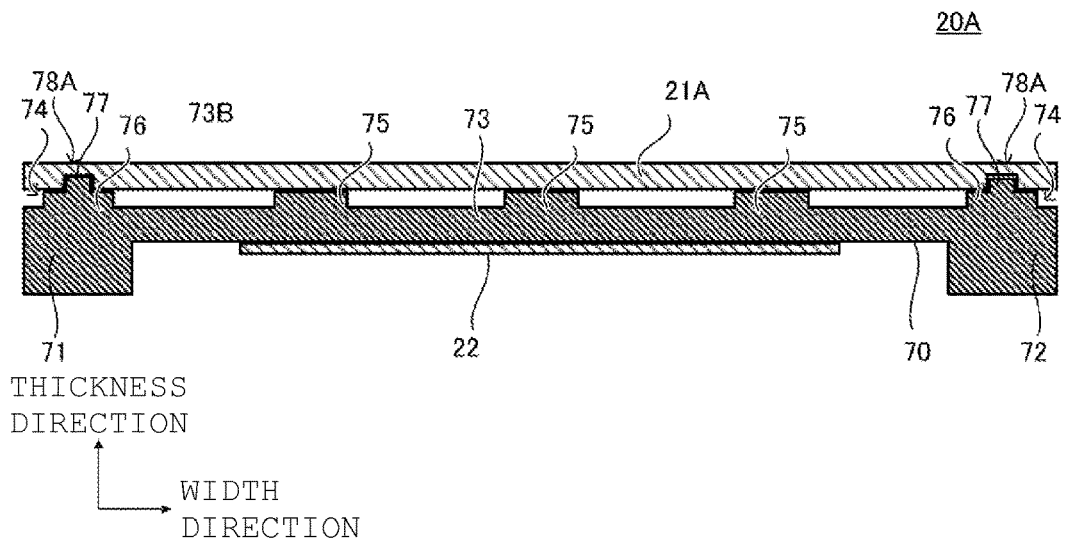
FIG. 6 is a cross-sectional view of the tactile sense presenting device according to a second exemplary embodiment.

Next, a vibrating device according to the second exemplary embodiment will be described. FIG. 6 is a cross-sectional view of a vibrating device 20A according to the second embodiment. Hereinafter, the same components as those according to the first embodiment will be assigned the same reference numerals, and will not be described.

The vibrating device 20A includes a diaphragm 21A. The diaphragm 21A has openings 78A having recess shapes which are non-through-holes opened on a bottom surface side. Small diameter portions 77 of first protrusions 74 of spacers 70 are fitted in these openings 78A.

Since the vibrating device 20A is configured in this manner, the openings 78A and the first protrusions 74 are not exposed on the top surface side of the diaphragm 21A. Thus, it is possible to enhance an aesthetic appearance and area utilization efficiency of the top surface of the diaphragm 21A.

Figure 7:
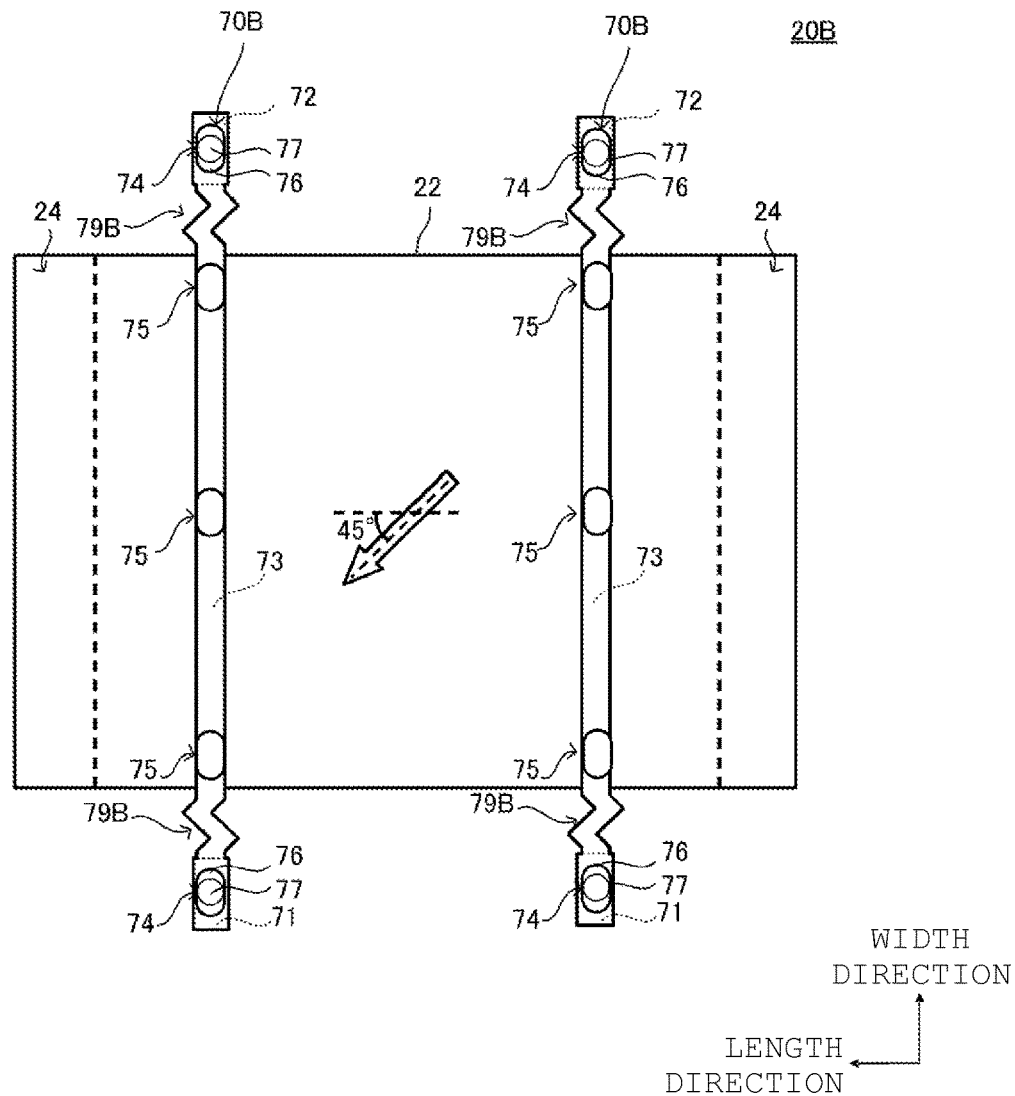
FIG. 7 is a plan view of a tactile sense presenting device according to a third exemplary embodiment without a diaphragm.

Next, a vibrating device according to a third exemplary embodiment will be described. FIG. 7 is a plan view of a vibrating device 20B according to the third exemplary embodiment without a diaphragm 21.

The vibrating device 20B includes spacers 70B. Each spacer 70B includes connecting portions 79B. The connecting portions 79B are formed at connecting portions between support legs 71 and 72 and a beam 73. Each connecting portion 79B has the same thickness as that of the beam 73 and extends while bending in a saw-tooth shape along a width direction of the vibrating device 20B.

The connecting portion 79B having such a shape has higher elasticity in the length direction of the vibrating device 20B than that of the beam 73, and the beam 73 is displacable in the length direction of the vibrating device 20B. That is, in this vibrating device 20B, the beam 73 is likely to be displaced in the length direction of the vibrating device 20, and a frictional resistance of a piezoelectric film 22 by the beam 73 is further reduced compared to the above-described embodiment. Thus, this vibrating device 20B can more easily obtain original vibration characteristics of the diaphragm 21 and the piezoelectric film 22 than in the above-described embodiment.

Next, modified examples of spacers applied to each of the above-described embodiments will be described.

Figure 8:
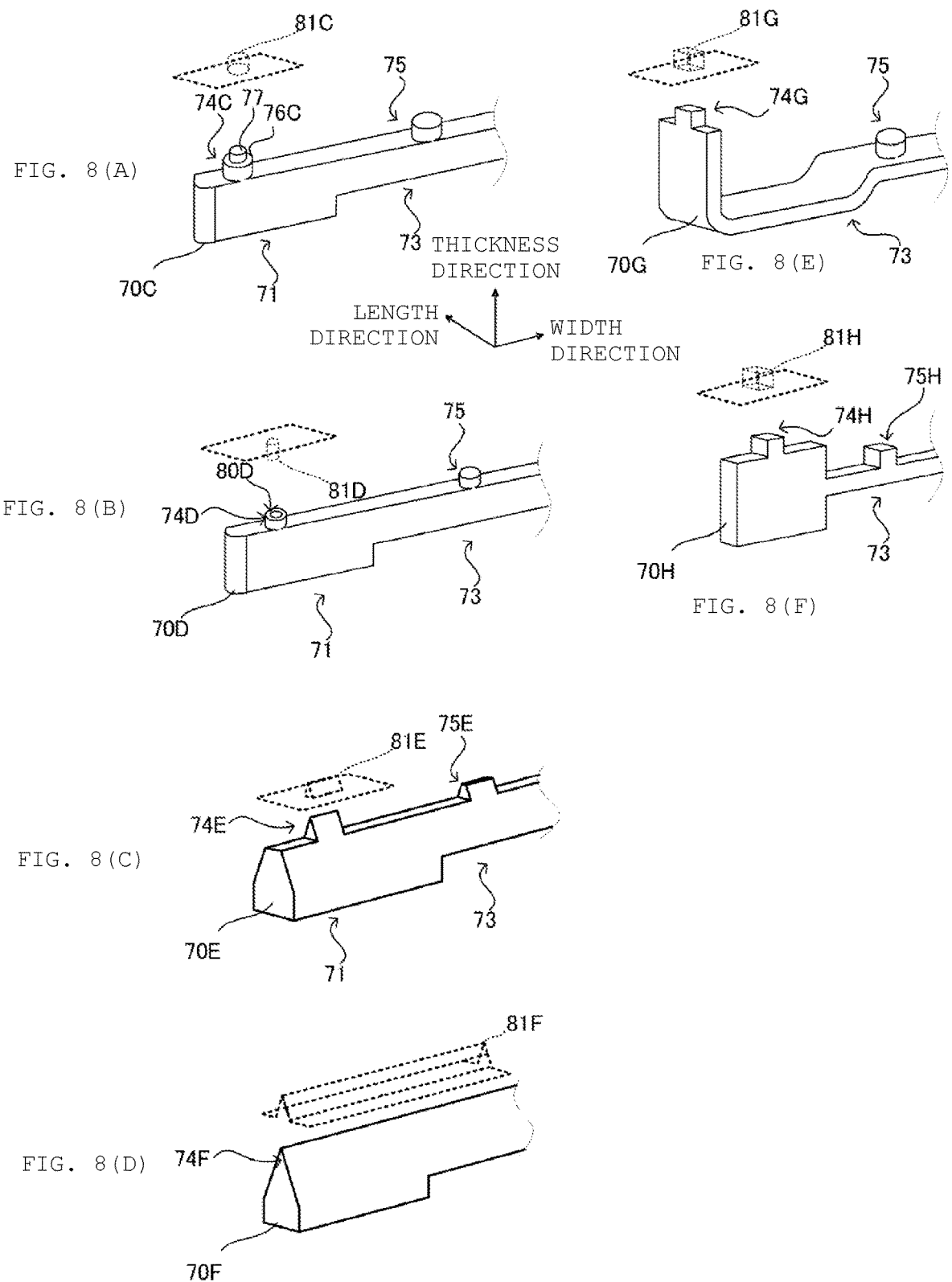
FIG. 8(A) is a perspective view for explaining a spacer according to a first modified example.
FIG. 8(B) is a perspective view for explaining a spacer according to a second modified example.
FIG. 8(C) is a perspective view for explaining a spacer according to a third modified example.
FIG. 8(D) is a perspective view for explaining a spacer according to a fourth modified example.
FIG. 8(E) is a perspective view for explaining a spacer according to a fifth modified example.
FIG. 8(F) is a perspective view for explaining a spacer according to a sixth modified example.
Figure 9:
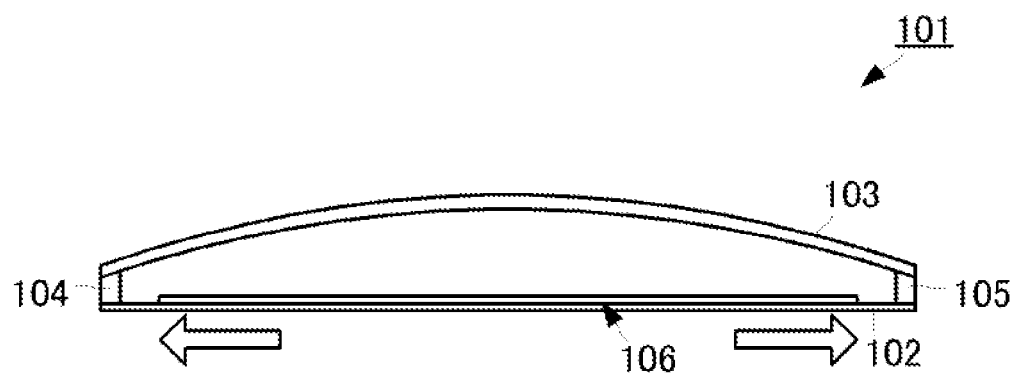
FIG. 9 is a view for explaining a conventional structure of a vibrating device.

FIG. 8(A) is a perspective view illustrating a spacer 70C according to a first modified example. This spacer 70C differs from the above-described configuration in that the spacer 70C includes first protrusions 74C. Each first protrusion 74C includes a large diameter portion 76C and a small diameter portion 77, and the large diameter portion 76C has a perfect circular shape in a plan view.

Upon comparison of the spacers 70C according to the first modified example with the above spacers 70, when the diameters of the small diameter portions 77 are equal, the large diameter portion 76C of the spacer 70C has a larger diameter in a length direction than the large diameter portion 76 of the spacer 70. Therefore, the spacer 70C according to the first modified example also easily comes into contact with a position, apart from a node point of the diaphragm 21 (not illustrated) in the length direction of the vibrating device 20. In contrast, the vibrating device 20 has high rigidity in the length direction and is difficult to bend in the length direction. On the other hand, as compared with the spacer 70C according to the first modification, the spacer 70 has low rigidity in the length direction of the vibrating device 20 and is easily bendable in the length direction of the vibrating device 20. However, the spacer 70 easily comes into contact with a position closer to a node point of the diaphragm 21 (not illustrated) in the length direction of the vibrating device 20.

Vibration of the diaphragm is less constrained when the spacers come into contact with positions closer to the node point in the diaphragm. Therefore, from a viewpoint of obtaining original vibration characteristics of the diaphragm, the above-described configuration of the spacers 70 having oval-shaped large diameter portions 76 is preferable. On the other hand, from a viewpoint that the spacers are hardly damaged and displacement hardly occurs, the rigidity of the spacers in the length direction of the vibrating device is desirably high. The configuration of the spacers 70C according to the first modified example having the large diameter portions 76C with the perfect circular shapes is preferable.

FIG. 8(B) is a perspective view illustrating a spacer 70D according to a second modified example. This spacer 70D differs from the above-described configuration in that the spacer 70D includes first protrusions 74D. Each first protrusion 74D has a columnar shape having a uniform diameter, and an opening 80D which is recessed toward a bottom surface is formed in a top face (top surface). The opening 80D of each spacer 70D is fitted to a first protrusion 81D formed on a diaphragm.

In this way, the first protrusions may be formed on the diaphragm side, and conversely the openings may be formed on the spacer side.

FIG. 8(C) is a perspective view illustrating a spacer 70E according to a third modified example. This spacer 70E differs from the above-described configuration in that the spacer 70E includes first protrusions 74E and second protrusions 75E. Each first protrusion 74E has a ridge shape extending in a width direction of the vibrating device. This ridge-shaped first protrusion 74E fits in a valley-shaped groove 81E formed in the diaphragm. Each second protrusion 75E has a shape in which a top portion of the ridge shape extending in the width direction of the vibrating device is flattened and a top face is formed in contact with a bottom surface of the diaphragm.

As described above, the shapes of the first protrusions and the second protrusions are not limited to columnar shapes, and may be other shapes such as a columnar shape having a polygonal cross section, a ridge shape, and a conical shape, for example.

FIG. 8(D) is a perspective view for explaining a spacer 70F according to a fourth modified example. This spacer 70F differs from the above-described configuration in that the spacer 70F includes first protrusions 74F, and does not include second protrusions. Each first protrusion 74F is a ridge-shaped portion extending over an entire width direction of a vibrating device, and is fitted in a groove-shaped opening 81F formed in a diaphragm.

In this way, the spacer can be formed by forming only the first protrusions without forming the second protrusions. In this case, each first protrusion may have an elongated shape extending to a position at which each first protrusion overlaps a film, or may have a short shape formed only at a position at which each first protrusion does not overlap with the film. Further, the positions at which each first protrusion and each opening are formed are not limited to a position at which each first protrusion and each opening do not overlap the film, and each first protrusion and each opening may be formed at positions at which each first protrusion and each opening overlap the film.

FIG. 8(E) is a perspective view for explaining a spacer 70G according to a fifth modified example. This spacer 70G differs from the above-described configuration in that the spacer 70G includes first protrusions 74G. Each first protrusion 74G has a columnar shape and is fitted into a recess 81G formed in a diaphragm. The recess 81G may have a cylindrical shape.

FIG. 8(F) is a perspective view for explaining a spacer 70H according to a sixth modified example. This spacer 70H differs from the above-described configuration in that the spacer 70H includes first protrusions 74H and second protrusions 75H. Each first protrusion 74H has a columnar shape and is fitted in a recess 81H formed in a diaphragm. The recess 81H may have a cylindrical shape. The second protrusion 75H has a shape in which a columnar shape formed at the upper portion of the beam 73 extending in the width direction of the vibrating device is formed.

In each of the above-described embodiments and modified examples, the example in which the vibrating device is used for the tactile sense presenting device has been described. However, the vibrating device of the exemplary embodiments are not limited to these examples, and other vibrating devices such as a flat type speaker may be used in the device.

Each of the above-described embodiments and modified examples has described an example where a piezoelectric film is used as a film. However, the film according to the present invention is not limited to this. For example, the film according to the present invention may be formed as an electrostrictive film, an electret film, a piezoelectric ceramic, a composite film formed by dispersing piezoelectric grains in a polymer, or an electroactive polymer film. The electroactive polymer film refers to a film which is electrically driven to produce a stress or a film which is electrically driven to deform and cause a displacement. More specifically, the electroactive polymer film includes an electrostrictive film, a composite material (a material formed by sealing piezoelectric ceramics with resin), an electrically driving elastomer, or a liquid crystal elastomer.

Lastly, it should be understood that explanation of each of the above embodiments and modified examples is exemplary in all aspects and is non-restrictive. The scope of the present invention is expressed by the claims not by the above embodiments. Further, the scope of the present invention intends to include all changes having meanings and a scope equivalent to the claims.

DESCRIPTION OF REFERENCE SYMBOLS

10: tactile sense presenting device
11: control unit
12: driving unit
20: vibrating device
21: diaphragm
22: piezoelectric film
24: fixed end
31: touch sensor
70: spacer
71, 72: support leg
73: beam
74: first protrusion
75: second protrusion
76: large diameter portion
77: small diameter portion
78: opening

The invention claimed is:

1. A vibrating device comprising:
   a diaphragm;
   a film that is bridged over the diaphragm and that is configured to stretch and contract in a planar direction; and
   a spacer that is fixed to the diaphragm and that is disposed in a gap between the film and the diaphragm.

2. The vibrating device according to claim 1, wherein the spacer is configured to slide against the film.

3. The vibrating device according to claim 1, further comprising:
   an opening disposed in the diaphragm; and
   a first protrusion extending from the spacer and fitted in the opening of the diaphragm.

4. The vibrating device according to claim 3, wherein the opening is a through-hole disposed in the diaphragm.

5. The vibrating device according to claim 3, wherein the opening is a recess shape in the diaphragm.

6. The vibrating device according to claim 3, wherein the first protrusion extends from a first side of the spacer and the film contacts a second side of the spacer opposite the first protrusion.

7. The vibrating device according to claim 3, wherein the spacer further includes a second protrusion that extends therefrom and contacts the diaphragm at a position different than the opening disposed in the diaphragm.

8. The vibrating device according to claim 3, wherein the first protrusion includes a large diameter portion having a cross sectional area greater than a cross sectional area of the opening, such that the large diameter portion is not fitted into the opening of the diaphragm.

9. The vibrating device according to claim 1, further comprising:
   an opening disposed in the spacer; and
   a first protrusion extending from the diaphragm and fitted in the opening of the spacer.

10. The vibrating device according to claim 1, wherein the spacer further includes a support leg that protrudes from a side of the spacer opposite the diaphragm.

11. The vibrating device according to claim 1, wherein the film comprises a planar piezoelectric film that is configured to stretch and contract in the planar direction when a voltage is applied thereto.

12. A tactile sense presenting device comprising:
   a vibrating device including:
      a diaphragm,
      a film that is bridged over the diaphragm and that is configured to stretch and contract in a planar direction, and
      a spacer that is fixed to the diaphragm and that is disposed in a gap between the film and the diaphragm;
   a detecting unit attached to the diaphragm and configured to detect a touch operation; and
   a driving unit configured to apply a drive voltage to the film when the detecting unit detects the touch operation.

13. The tactile sense presenting device according to claim 12, wherein the spacer is configured to slide against the film.

14. The tactile sense presenting device according to claim 12, wherein the film comprises a planar piezoelectric film that is configured to stretch and contract in the planar direction when a voltage is applied thereto.

15. A vibrating device comprising:
- a diaphragm having a main body with respective ends opposing each other in a lengthwise direction of the main body;
- a film coupled to the respective ends of the main body of the diaphragm; and
- a pair of spacers extending in a widthwise direction of the diaphragm and the film and disposed in a gap between the film and the diaphragm.

16. The vibrating device according to claim 15, wherein the pair of spacers extend in a direction parallel to each other and are each fixed to the diaphragm at positions internal to the respective sides of the diaphragm where the film is coupled.

17. The vibrating device according to claim 16, wherein the film is bridged over the diaphragm and configured to stretch and contract in a planar direction when a voltage is applied thereto, and wherein the spacer is configured to slide against the film when the film stretches and contracts in the planar direction.

18. The vibrating device according to claim 16, wherein the pair of spacers each include a pair of support legs extending therefrom in a direction opposite to the diaphragm with the film disposed between each of the support legs of each spacer.

19. The vibrating device according to claim 15, further comprising:
- a plurality of openings disposed in the diaphragm; and
- a plurality of protrusions extending from each of the pair of spacers that are each fitted in respective openings of the diaphragm.

20. The vibrating device according to claim 15, wherein the film comprises a planar piezoelectric film that is configured to stretch and contract in the planar direction when a voltage is applied thereto.

* * * * *